United States Patent [19]

Fowler et al.

[11] Patent Number: 4,672,423
[45] Date of Patent: Jun. 9, 1987

[54] VOLTAGE CONTROLLED RESONANT TRANSMISSION SEMICONDUCTOR DEVICE

[75] Inventors: Alan B. Fowler, Yorktown Heights; Allan M. Hartstein, Chappaqua, both of N.Y.

[73] Assignee: International Business Machines Corporation, Armonk, N.Y.

[21] Appl. No.: 801,497

[22] Filed: Nov. 22, 1985

Related U.S. Application Data

[63] Continuation of Ser. No. 429,647, Sep. 30, 1982.

[51] Int. Cl.[4] .................................. H01L 29/78
[52] U.S. Cl. .......................... 357/23.3; 357/23.14; 357/59; 357/22
[58] Field of Search .................. 357/4, 22, 6, 23.1, 357/23.2, 23.13, 23.12, 23.14, 23.3, 12, 596, 22 MD

[56] References Cited

U.S. PATENT DOCUMENTS

| | | | |
|---|---|---|---|
| 3,358,158 | 12/1967 | Tiemann | 307/88.5 |
| 3,374,407 | 3/1968 | Olmstead | 357/23.12 |
| 3,439,236 | 4/1969 | Blicher | 357/23.12 |
| 3,657,614 | 4/1972 | Cricchi | 357/23.14 X |
| 3,878,549 | 4/1975 | Yamazaki et al. | 357/23.5 |
| 3,951,708 | 4/1976 | Dean | 156/3 |
| 3,996,655 | 12/1976 | Cunningham et al. | 29/571 |
| 4,037,307 | 7/1977 | Smith | 357/23.3 X |
| 4,037,308 | 7/1977 | Smith | 29/571 |
| 4,156,879 | 5/1979 | Lee | 357/22 |
| 4,160,261 | 7/1979 | Casey, Jr. et al. | 357/16 X |
| 4,161,739 | 7/1979 | Messick | 357/23 |
| 4,189,737 | 2/1980 | Schrader et al. | 357/23.3 |
| 4,190,850 | 2/1980 | Tihanyi et al. | 357/23 |
| 4,231,050 | 10/1980 | Casey, Jr. et al. | 357/16 |
| 4,306,352 | 12/1981 | Schrader | 357/23.3 X |
| 4,358,340 | 11/1982 | Fu | 357/23.3 X |
| 4,366,493 | 12/1982 | Braslau et al. | 357/22 |
| 4,482,910 | 11/1984 | Nishizawa et al. | 357/16 X |

FOREIGN PATENT DOCUMENTS

| | | | |
|---|---|---|---|
| 58-25272 | 2/1983 | Japan | 357/23.3 |
| 0710086 | 1/1980 | U.S.S.R. | 357/4 |

OTHER PUBLICATIONS

Lee, "Inversion Charge Transistor", *IBM Technical Disclosure Bulletin*, vol. 21, No. 1, June 1978, pp. 86–87.

Jackson et al, "A Novel Submicron Fabrication Technique", *Semiconductor International*, March 1980, pp. 77–83.

Chang et al, "Resonant Tunneling in Semiconductor Double Barriers", *Appl. Phys. Lett.*, vol. 24, No. 12, 15 June 1974, pp. 593–595.

Lee et al, "High Transconductance Inversion Charge Transistor", *IBM Tech. Discl. Bulletin*, vol. 22, No. 7, Dec. 1979, pp. 2678–2680.

Abbas et al, "Formation of Sub-Micron Patterns with Negigible Tolerance", *IBM Tech. Discl. Bull.*, vol. 26, No. 6, Nov. 83, 2732.

IBM Technical Disclosure Bulletin, vol. 21, No. 1, June 1978, pp. 86–87, "Inversion Charge Transistor" by H. S. Lee.

Applied Phys. Lett. 38(7), 1 April 1981, pp. 532–534, "Generation of Surface Gratings with Periods < 1000A" by Johnson et al.

*Primary Examiner*—Andrew J. James
*Assistant Examiner*—William A. Mintel
*Attorney, Agent, or Firm*—Alvin J. Riddles

[57] ABSTRACT

In a transistor structure a buried gate positioned in the layer above a conduction channel and below a broad gate which overlaps the source and drain, when the voltages applied to the buried gate and the overlapping gate are varied independently, a potential well between two barriers can be established which permits conduction by the physical mechanism of resonant transmission. The potential well between two barriers required for the resonant transmission mechanism is achieved in one structure by a buried gate under an overlapping gate with both width and separation dimension control and in a second structure using split-buried gate under an overlapping gate that is embossed in the region of the split gate. With gate and separation dimensions of the order of 1000 Å switching speeds of the order of $10^{-12}$ seconds are achieved.

12 Claims, 9 Drawing Figures

VOLTAGE CONTROLLED RESONANT TRANSMISSION SEMICONDUCTOR DEVICE

This application is a continuation of application Ser. No. 06/429,647 filed Sept. 30, 1982.

TECHNICAL FIELD

The technical field of the invention is that of high speed semiconductor switching devices. However, as the performance of such devices approaches speeds of $10^{-9}$ seconds, the standard mode of carrier transport in the device which involved minority carrier motion by diffusion requires a time that is becoming an increasingly significant limitation.

BACKGROUND ART

One approach to avoiding the minority carrier transport time limitation has been to build devices that rely on carrier flow using the mechanism of resonant quantum mechanical transmission through multiple barriers.

Resonant quantum mechanical transmission has been reported in Applied Physics Letters 24, 12, 15 June 1974, as a physical mechanism that could be employed to produce a particularly high speed type of device. One type of structure employing this physical mechanism is shown in copending application Ser. No. 280,141, filed June 30, 1981, now abandoned; also identified as European Patent Publication No. 0068064 05/01/83, in which a device has three contiguous layer regions of the same conductivity type semiconductor material with two identical barriers between the external layers and the internal layer.

DISCLOSURE OF THE INVENTION

A structural principle is provided for a triode type semiconductor device employing the resonant transmission physical mechanism for conduction wherein the conduction is in a planar surface region between high conductivity electrodes in a semiconductor crystal and the barriers and potential well for the resonant transmission physical mechanism are achieved through a combination of insulating layer thickness dimensions, small gate width and spacing dimensions and an overlapping larger gate and application of potentials between the two gate regions.

The structure of the invention may be compared to a field effect transistor wherein carrier conduction takes place in a channel which is a region of a semiconductor adjacent a surface between two high conductivity electrode regions called a source and a drain.

In accordance with this invention, a potential well is produced between at least two reflecting barriers penetrating the carrier conduction region by providing a small gate in the layer over the carrier conduction region and a broad gate over the layer that overlaps the source and drain and the small gate. A bias voltage applied to the broad gate sets a barrier level and within that level a different bias voltage applied to the small gate operates to produce a potential well.

BEST MODE FOR CARRYING OUT THE INVENTION

Figure 1:
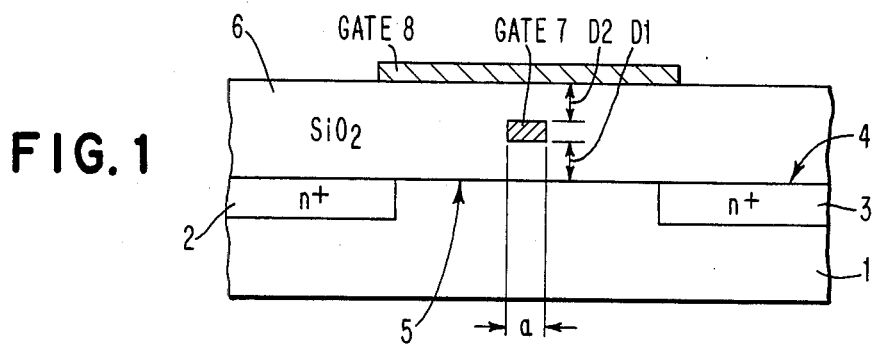
FIG. 1 is a schematic view of the structure of one embodiment of the invention.

Referring to FIG. 1, a semiconductor body 1 of, for example, silicon is provided. For purposes of illustration, a particular conductivity type will be assigned although to one skilled in the art the transition to the opposite conductivity type arrangement can be readily achieved. In the region 1, the p-type conductivity is assigned. High conductivity type external contact regions 2 and 3, serve the general function of the source and drain type contacts in field effect transistors. The contacts 2 and 3 are at each end of a portion of the p region extending along the surface 4 of the crystal 1 in an area 5 similar to the channel in a conventional field effect transistor. Over the surface 4 of the original body 1, a region of insulating material 6 such as $SiO_2$ is provided. Within the region essentially centered over the channel region 4 a small area gate 7 is provided. The gate 7 is separated from the channel 4 by a first dimension D1. A second broader area gate 8 that overlaps the source 2 and drain 3 is provided over the surface of the insulating material 6 separated from the gate 7 by a dimension D2. The dimension a of the gate 7 and dimensions D1 and D2 are of the order of 100 to 200 Å.

Where, for example, the structure involves GaAs as the substrate 1 and GaAlAs as the material 6 and the channel 5 is a modulation doped carrier conductivity region, the mean free path is longer and the mass is lighter than in the silicon example and that the dimension a of the gate 7 can be larger. The modulation doped conductivity channel is a region adjacent to an interface with a different semiconductor so that electrons associated with doping in one semiconductor provide carriers in the adjacent semiconductor without the reduced mobility due to collisions with doping atoms. The field in this invention will modulate the conductivity at this type of interface.

The structure of FIG. 1 can be made by a variety of techniques known in the semiconductor industry and a preferred technique is disclosed in copending application Ser. No. 271,303 filed June 8, 1981, wherein in essence a step is made in the insulating material and a diagonal deposition of metal which serves as the gate 7 is placed against the side of the step and thereafter another insulating material growth takes place.

Figure 2:
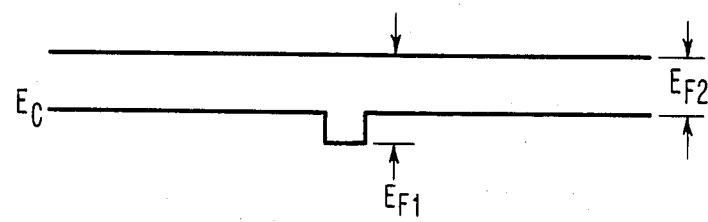
FIGS. 2 and 3 are energy level diagrams under the influence of bias dimensionally correlated with FIG. 1, indicating the presence of a potential well.
Figure 3:
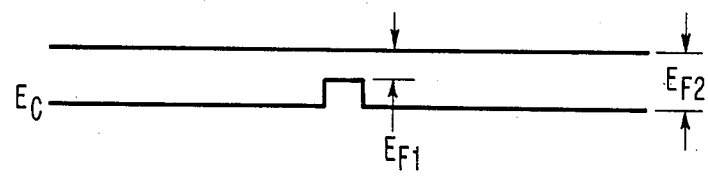

The resonant transmission of the invention is achieved through the small size of the gate 7 and the ability to vary independently voltages on gate 7 and gate 8. The performance is described in connection with FIGS. 2 and 3 which are energy level diagrams under the influence of bias. In FIGS. 2 and 3, $E_C$ is the conduction band edge and $E_{F1}$ and $E_{F2}$ are the Fermi energies above the conduction band edge for the regions under gate 7 depending on the biases on gate 7 in relation to gate 8. The potentials are idealized.

In the structures employing the invention, the length through the barrier dimension a in FIG. 1 must be less than the mean free path of a carrier.

The following discussion will be provided using as an approximation a one-dimensional condition although one skilled in the art in the light of the principles set forth will readily extend those principles to a two-dimensional structure.

Considering first the condition of FIG. 2, the transmission coefficient for an electron at the Fermi surface below gate 8 past the potential well is as expressed by Equation 1.

$$T = \left[ 1 + \frac{(E_{F2} - E_{F1})^2 \sin^2 \alpha a}{4E_{F2} E_{F1}} \right]^{-1} \qquad \text{Eq. 1}$$

where a is the length of the barrier, and $$\alpha = \left[ \frac{2m(E_{F1})}{n^2} \right]^{\frac{1}{2}}$$

where m is the effective mass of the carrier (electron) parallel to the surface and where $\overset{+}{n}$ is $\dfrac{\text{Planck's constant}}{2\pi}$ Under the conditions of Equation 1, the maximum T would be 1 and the minimum would be of the order of 0.2 where $E_{F1}$ is equal to 70 meV and $E_{F2}$ is of the order of 4 meV. As an example a is 200 Angstroms.

Under these conditions, the transmission would fluctuate because the $\sin^2\alpha a$ term of Equation 1, the minima and maxima of T, have been found to occur with a period given by $\alpha a = \pi$. Thus, if $E_{F1}$ is varied by 3.8 millielectron volts (meV), for the above example the transmission will go through a minimum and return to a maximum. Where the dimension D1 is of the order of 200 Angstroms under gate 7 and the dimension D2 is about 200 Angstroms between gate 7 and gate 8, a change at gate 7 of 0.5 volts is required to effect a change whereas where D1 is reduced to about 100 Angstroms, only 0.25 volts is required.

Referring next to FIG. 3, the relative potentials on gates 7 and 8 are such that $E_{F1}$ under gate 7 is less than $E_{F2}$. The transmission T obeys the law of Equation 1 but now T will only be small when $E_{F1}$ is small. The first resonance will occur for $\alpha a = \pi/2$. Under conditions where a is equal to 200 Angstroms, $E_{F1}$ would be 1.17 meV. If $E_{F2}$ were to be 50 meV, then T would be equal to 0.09.

In a majority carrier type device there is particular sensitivity to series resistance. One advantage of the arrangement of FIG. 2 is that series resistance is less.

The series resistance of this type of structure is governed by the expression of Equation 2.

$$\frac{1}{R_S} = e \, n_{s2} \, \mu \, \frac{W}{L} \cong \frac{1}{250} \, \text{ohm}^{-1} \qquad \text{Eq. 2}$$

For an example set of conditions where
(W) Width = (L) Length and
where
e is electron charge
$n_{S2}$ is carrier density at the surface
$\mu$ is the mobility of the carriers The conductance for a single barrier can be established through the Landauer formula as published in the Zeitschrift der Physik B 247, 1975, and set forth in Equation 3.

$$G = \frac{e^2}{2} \left( \frac{n \, k}{m} \right) \frac{T}{1 - T} \frac{1}{dE_{F2}/dn_{s2}} \qquad \text{Eq. 3}$$

where
n is Planck's constant
k is wave vector in the region adjacent to the barrier
m is effective mass of the carrier (electron)
$E_{F2}$ is Fermi energy in region adjacent the barrier Under these circumstances for the energy conditions of FIG. 2, R would be equal to 260 ohms. Thus, the resistance of the barrier can be of the order of the series resistance and meaningful modulation can be accomplished.

The gain of the device of the invention is large. In the energy condition of FIG. 2, the shift in energy is about 1 meV. This corresponds to about $1.6 \times 10^{11}$ carriers per square centimeter. For a dimension D1 of approximately 100 Angstroms this would require less than 0.1 volt with the transconductance ($G_m$) being about 1/25 which is extremely large when it is considered that the example has a width to length ratio of 1.

The device under the energy conditions of FIG. 2 in the absence of special measures will remain on. Such a structure would be useful as a linear amplifier.

For the energy conditions of FIG. 3, there will be many resonances of comparable depth and where bias voltages are arranged to swing through all of them, the structure can serve as a frequency multiplier.

There will be structural variations such as the providing of a grating of steps placed in the gate area 5 so that the gain of the device would be increased because as set forth in connection with Equation 5 the resistance would have to be multiplied by the number of narrow gates or wells. This would improve the ratio of the barrier resistance to the series resistance.

A further structural variation would occur if the width of the device were to be decreased to produce a width to length ratio of 1. This would cause the series resistance to be unchanged but the barrier resistance to increase.

Figure 4:
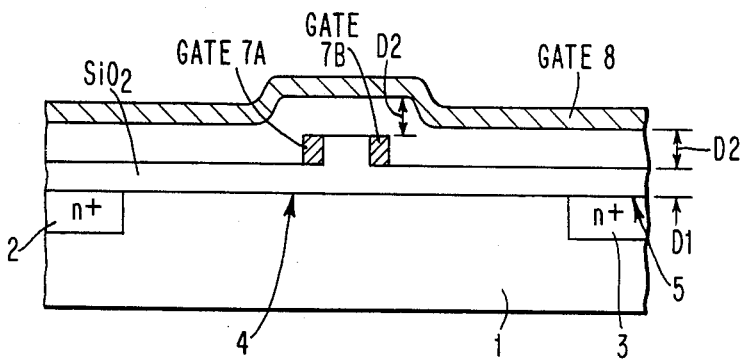
FIG. 4 is another embodiment of the invention.
Figure 5:
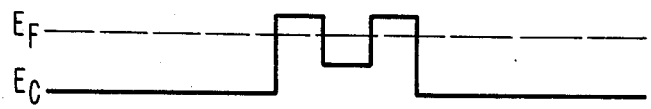
FIG. 5 is an energy level diagram under the influence of bias dimensionally correlated with the structure of FIG. 4, illustrating the barriers and potential well.

In accordance with the principles of the invention, the use of multiple small gates will produce a potential well between them as shown in FIGS. 4 and 5.

Referring next to FIG. 4, this condition is illustrated wherein the structure is shown with the same reference numerals for elements with similar functions. Here however the gate 7 of FIG. 1 is now made in two parts, 7A and 7B, and the gate 8 is farther away from the channel 4 only over the gate 7. The dimension D2 between the gate 8 and the gate 7 is thus essentially the same from the top of gate 7 to gate 8 over gate 7 and from gate 8 to the channel 4. Under these conditions, a bias on the gate 8 is changed by the multi-part gate 7A and 7B and positions the band level above the Fermi level under each portion of the gate providing the potential well under the oxide between them as shown in the dimensionally correlated energy diagram of FIG. 5.

The structure of FIG. 4 can be achieved by using an edge deposited metal member which can be of a dimension of the order of 100 to 1000 Å as a mask in the formation of a mesa and then edge depositing the members 7A and 7B on each side. A process for producing the structure of FIG. 4 is illustrated in connection with FIGS. 6, 7 and 8 wherein like reference numerals are used with FIG. 4.

Figure 6:
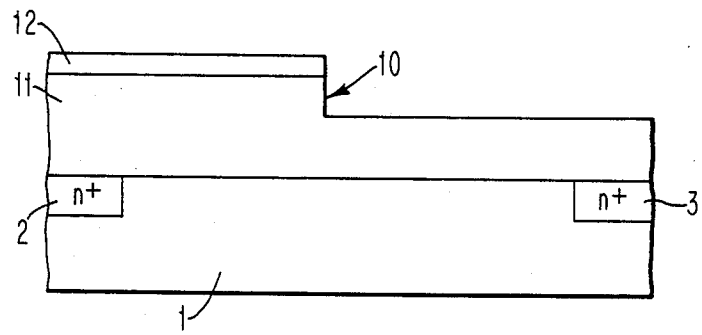
FIGS. 6, 7, 8 and 9 are process step illustrations in the production of FIG. 4.

Referring to FIG. 6, a step 10 in the layer 11, such as SiO$_2$, is formed by masking with a Reactive Ion Etch (RIE) resist 12, such as A1, and then using RIE to remove the unmasked material to the desired depth. Alternately, all unmasked oxide can be removed and regrown to produce the structure in FIG. 6.

Figure 7:
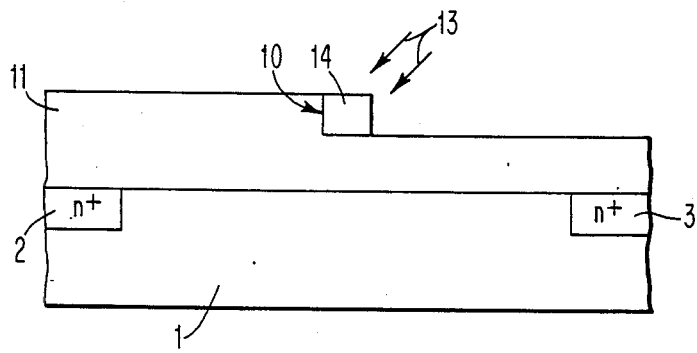

Referring to FIG. 7, after dip etch removal of the mask 12 of FIG. 6, using a deposition from an angle such as 70° as shown by arrows 13, an RIE mask 14 of such as A1 is formed. The angle deposition provides a thicker deposit on the vertical and a thinner deposit on the horizontal. FIG. 7 shows the structure after etching off the deposited material on the horizontal.

Figure 8:
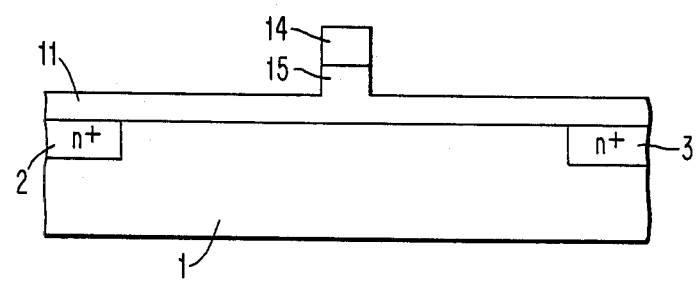

In FIG. 8, RIE is used to provide a mesa 15 by removal of the layer 10 when not masked by the member 14. Similarly, an alternative is that all unmasked oxide can be removed and regrown to produce the structure in FIG. 6.

Figure 9:
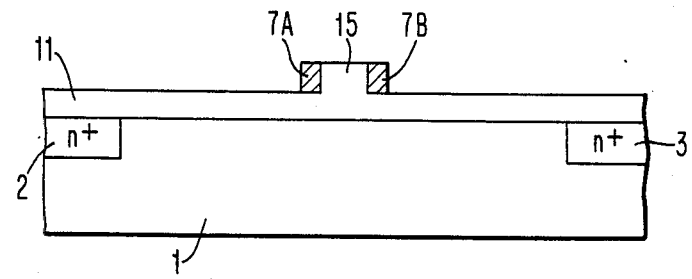

In FIG. 9, after the member 14 has been etched away, an edge deposition on each side of the mesa 15 produces the gates 7A and 7B.

An additional growth step the thickness of the dimension D2 will permit a gate 8 to be deposited that will be the same distance D2 over both the substrate and over the gates 7A and 7B.

The separation of the parts 7A and 7B of the split gate can be of the order of 100 Angstroms to 1,000 Angstroms and the thickness of each part 7A and 7B of the split gate can be of the order of 150 to 1,000 Angstroms.

Under biasing conditions wherein gate 8 is subjected to bias and the split gate 7A and 7B is biased differently from gate 8, the energy band diagram is as shown in FIG. 5. It should be noted in connection with FIG. 5 that the conduction band edge under the split gate region can take on any level produced by the gate voltage conditions. The widths of all the barriers and the well can be chosen by the physical sizes of the gates, the processing and the dimensions D1 and D2. The Fermi level energy is controlled by the gate voltage on gate 8 whereas the height of the barriers is controlled by a gate voltage on the split gate 7.

In this structure, electron transmission through the device will show resonances as the electron wavelength varies in the central quantum or potential well in FIG. 5. Both the voltage on the split gate 7A and 7B and on the overlapping gate 8 will control the resonance conditions. The transmission and hence the device resistance will oscillate as various standing wave conditions are met in the central well region. The structure of FIG. 4 is thus particularly useful both as a high speed of response amplifier and as a frequency multiplier.

What has been described is a semiconductor structural principle for the use of resonant transmission carrier conduction. The structure is gate controlled involving a small area gate positioned in an insulator over a carrier conduction region under a broader gate.

Having thus described our invention, what we claim as new and desire to secure by Letters Patent is:

1. A resonant transmission semiconductor device comprising:
   a semiconductor crystal having in one face thereof separated first and second high conductivity electrode regions,
   a layer having first and second major surfaces exhibiting insulating properties with respect to said semiconductor crystal having a first said major surface in contact with said face of said crystal,
   a first gate electrode in contact with the second said major surface of said insulating layer and having a length dimension sufficient that said gate electrode covers the separation distance between said first and second high conductivity electrode regions and extend over said first and second high conductivity electrode regions,
   a second gate electrode positioned within said insulating layer, separated from said crystal face a distance of the order of 100 to 200 Å, separated from said first gate a distance of the order of 100 to 200 Å and located within said separation distance, said second gate electrode having a 100 to 1000 Å range dimension parallel to said crystal face, said 100 to 1000 Å range dimension being less than said separation of said first and second high conductivity electrode regions, and
   interdependent resonant transmission bias means consisting of first bias means in the form of a first potential difference connected to said first gate electrode and to said crystal in a magnitude to provide a fixed specific separation of the conduction energy band and the Fermi energy band level in said portion of said crystal between said first and said second high conductivity electrode regions, and
   second bias means in the form of a second potential difference connected to said second gate electrode and to said semiconductor crystal in a magnitude operable to provide a localized different separation from said fixed specific separation of the conduction energy band and the Fermi energy band thereby to position at least one potential well in said region between said first and said second high conductivity electrode regions.

2. The device of claim 1 wherein said semiconductor is silicon.

3. The device of claim 1 wherein said semiconductor is GaAs and said insulating layer is GaAlAs.

4. The structure of claim 1 wherein the relationship of said first and second bias means is operable to add said localized separation to said fixed specific separation.

5. The structure of claim 1 wherein the relationship of said first and second bias means is operable to subtract said localized separation from said fixed specific separation.

6. The structure of claim 1 wherein said second gate electrode has at least two segments, each having a 100 to 1000 Å dimension parallel to said face separated by a 100 to 1000 Å dimension, the combination of said segment dimensions and said separation being less than said separation of said high conductivity electrodes, said first gate in the region over said second gate segments being separated by a 100 to 200 Å distance.

7. A semiconductor crystal structure having separated first and second high conductivity electrode region in one face thereof,
   a first gate electrode having at least one segment positioned over the portion of said face between said high conductivity electrode, separated from said face by a 100 to 200 Å dimension of insulating material, said first gate electrode having at least one 100 to 1000 Å range segment dimension parallel to said crystal face, said 100 to 1000 Å range dimension being less than said separation of said high conductivity electrodes,
   a second gate electrode separated by insulating material from said first gate electrode by a 100 to 200 Å distance dimension and extending from a position over said first high conductivity electrode to a position over said second high conductivity electrode, and interdependent resonant transmission bias means consisting of first bias means in the form of a first potential difference connected to said second gate electrode and to said semiconductor crystal and operable to provide a specific conduction energy band and the Fermi energy band level separation in said first distance, and second bias means in the form of a second potential difference connected to said first gate electrode and to said semiconductor crystal and operable to provide a localized different energy band separation providing thereby at least one potential well in said first distance.

8. The structure of claim 7 wherein said semiconductor crystal is silicon.

9. The structure of claim 7 wherein said semiconductor crystal is GaAs and said insulating layer is GaAlAs.

10. The structure of claim 7 wherein the relationship of said first and second bias means is operable to add said localized separation to said fixed specific separation.

11. The structure of claim 7 wherein the relationship of said first and second bias means is operable to subtract said localized separation from said fixed specific separation.

12. The structure of claim 7 wherein said first gate electrode has at least two segments, each having a 100 to 1000 Å dimension parallel to said crystal face separated by a 100 to 1000 Å dimension, the combination of the segment dimensions and the separation being less than said separation of said high conductivity electrodes, said first gate in the region over said second gate segments being separated by a 100 to 200 Å dimension.

* * * * *